(12) United States Patent
Duxbury et al.

(10) Patent No.: US 11,258,470 B2
(45) Date of Patent: Feb. 22, 2022

(54) WIRELESS TRANSCEIVER

(71) Applicant: SEMICONDUCTOR COMPONENTS INDUSTRIES, LLC, Phoenix, AZ (US)

(72) Inventors: Simon Duxbury, Piedmont, CA (US); Wing Kai Chong, San Ramon, CA (US); Didier Margairaz, San Jose, CA (US); Bahador Amiri, Saratoga, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/918,574

(22) Filed: Jul. 1, 2020

(65) Prior Publication Data
US 2021/0028801 A1    Jan. 28, 2021

Related U.S. Application Data

(60) Provisional application No. 62/877,757, filed on Jul. 23, 2019.

(51) Int. Cl.
*H04B 1/00* (2006.01)
*H03F 3/24* (2006.01)
*H04B 1/48* (2006.01)

(52) U.S. Cl.
CPC ......... *H04B 1/0096* (2013.01); *H03F 3/245* (2013.01); *H04B 1/0057* (2013.01); *H04B 1/48* (2013.01); *H03F 2200/451* (2013.01)

(58) Field of Classification Search
CPC .... H04B 1/0057; H04B 1/006; H04B 1/0458; H04B 1/04; H04B 1/0483; H04B 1/44; H04B 1/48; H04B 1/525; H04B 1/0067; H04B 1/38; H04B 1/401; H04B 1/005; H04B 1/0096; H04B 1/40; H03F 3/245; H03F 2200/451
See application file for complete search history.

(56) References Cited

U.S. PATENT DOCUMENTS 8,289,910 B2    10/2012    Gabriel et al.
8,483,200 B2    7/2013    Cha et al.
(Continued)

FOREIGN PATENT DOCUMENTS

WO    2016011197 A2    1/2016

OTHER PUBLICATIONS

European Patent Application No. 20183879.4 Search Report dated Dec. 15, 2020.

*Primary Examiner* — Vineeta S Panwalkar
(74) *Attorney, Agent, or Firm* — Maschoff Brennan

(57) ABSTRACT

An example device may include an antenna node configured to be coupled to an antenna element. The antenna node may be configured to pass wireless communications over multiple frequency bands. The device may also include multiple signal paths coupled to the antenna node. Each of the multiple signal paths may be configured to carry a signal from a different one of the multiple frequency bands. The device may further include a switch element coupled to the antenna node by the multiple signal paths and an amplifier circuit within the multiple signal paths between the switch element and the antenna node. The amplifier circuit may be configured to amplify the signals carried by the multiple signal paths.

19 Claims, 6 Drawing Sheets

(56) References Cited

U.S. PATENT DOCUMENTS

| | | | |
|---|---|---|---|
| 8,891,464 B2 | 11/2014 | Picker | |
| 9,319,257 B2 | 4/2016 | Campos et al. | |
| 9,319,950 B2 | 4/2016 | Seok | |
| 9,496,932 B1 | 11/2016 | Prendergast et al. | |
| 9,763,117 B2 | 9/2017 | Amini et al. | |
| 10,298,299 B1 | 5/2019 | Duxbury et al. | |
| 10,985,784 B2* | 4/2021 | King | H04B 7/0825 |
| 2008/0014892 A1 | 1/2008 | Aldana | |
| 2012/0120998 A1 | 5/2012 | Fakhrai et al. | |
| 2013/0039355 A1 | 2/2013 | de la Garrigue | |
| 2013/0259101 A1 | 10/2013 | Earnshaw et al. | |
| 2013/0336242 A1 | 12/2013 | Rajagopal et al. | |
| 2014/0119245 A1 | 5/2014 | Desjardins | |
| 2015/0110049 A1 | 4/2015 | Pabla | |
| 2016/0127025 A1 | 5/2016 | Wloczysiak | |
| 2016/0336972 A1* | 11/2016 | Khlat | H04B 1/006 |
| 2017/0005639 A1 | 1/2017 | Khlat et al. | |
| 2018/0167094 A1 | 6/2018 | Aramata | |
| 2018/0234141 A1 | 8/2018 | Silverman et al. | |
| 2019/0081596 A1* | 3/2019 | Dunworth | H03F 3/211 |
| 2019/0103843 A1 | 4/2019 | Aikawa | |

* cited by examiner

WIRELESS TRANSCEIVER

CROSS-REFERENCE TO RELATED APPLICATION

This patent application claims priority to U.S. Provisional Patent Application No. 62/877,757, filed on Jul. 23, 2019, which is incorporated herein by reference in its entirety.

FIELD

The implementations discussed herein are related to a wireless transceiver.

BACKGROUND

Unless otherwise indicated herein, the materials described herein are not prior art to the claims in the present application and are not admitted to be prior art by inclusion in this section.

Wireless local area networks (WLAN) may be established using a device called a Wireless Access Point (WAP). The WAP may wirelessly couple all of the devices of the local network, e.g. wireless stations such as digital devices to one another and to other networks. A WAP may operate on a communication band such as a 2.4 GHz or 5 GHz communication band.

The subject matter claimed herein is not limited to implementations that solve any disadvantages or that operate only in environments such as those described above. Rather, this background is only provided to illustrate one example technology area where some implementations described herein may be practiced.

SUMMARY

An example device may include an antenna node configured to be coupled to an antenna element. The antenna node may be configured to pass wireless communications over multiple frequency bands. The device may also include multiple signal paths coupled to the antenna node. Each of the multiple signal paths may be configured to carry a signal from a different one of the multiple frequency bands. The device may further include a switch element coupled to the antenna node by the multiple signal paths and an amplifier circuit within the multiple signal paths between the switch element and the antenna node. The amplifier circuit may be configured to amplify the signals carried by the multiple signal paths.

BRIEF DESCRIPTION OF THE DRAWINGS

Example implementations will be described and explained with additional specificity and detail using the accompanying drawings in which.

DETAILED DESCRIPTION OF SOME EXAMPLE IMPLEMENTATIONS

Implementations described herein may generally include a wireless transceiver.

In some embodiments, a wireless transceiver described in this disclosure may include multiple transmitter/receiver chains that are each configured to couple an antenna to baseband circuitry. Each of the transmitter/receiver chains may be configured to handle signals from multiple different frequency bands, such as signals from the 2.4 GHz, the 5 GHz, and/or the 6 GHz frequency bands, among other frequency bands. As such, the wireless transceiver may be able to configure the multiple transmitter/receiver chains in any number of different configurations. For example, any number of the transmitter/receiver chains may be configured for a first frequency band and the remaining transmitter/receiver chains may be configured for a second frequency band. As another example, all of the transmitter/receiver chains may be configured for a first frequency band. Alternately or additionally, the transmitter/receiver chains may be divided amongst three or more frequency bands.

In some embodiments, the transmitter/receiver chains may be configured to handle signals from multiple different frequency bands by including multiple signal paths that may be selected by switching elements. Each of the signal paths may be configured for one of the frequency bands supported by the transmitter/receiver chains. In these and other embodiments, the signals paths may include amplifier circuits between the antennas and the switching elements that may be configured to amplify the signals carried by the signal paths.

Reference will now be made to the drawings to describe various aspects of example implementations of the present disclosure. It is to be understood that the drawings are diagrammatic and schematic representations of such example implementations, and are not limiting of the present disclosure, nor are they necessarily drawn to scale.

Figure 1:
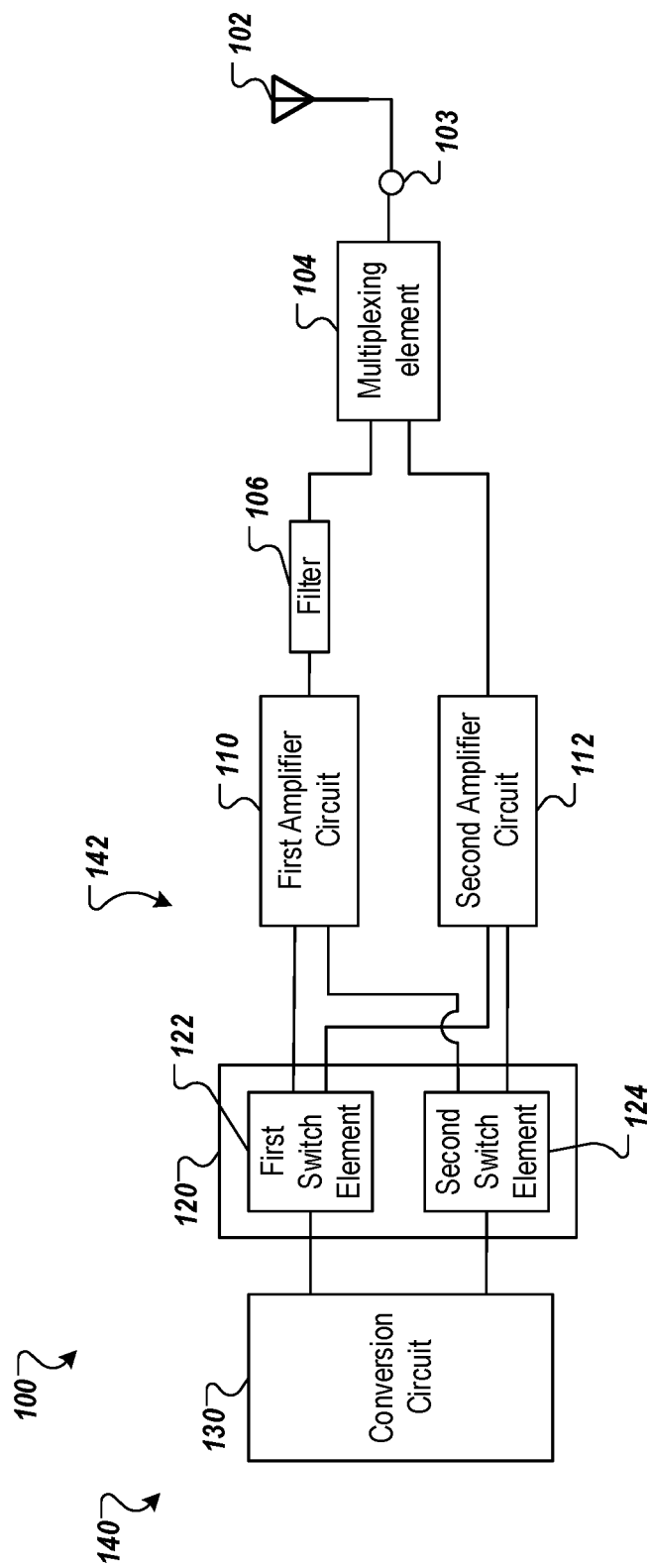
FIG. 1 illustrates an example environment that includes a wireless transceiver.

FIG. 1 illustrates an example environment 100 that may include a wireless transceiver 140, in accordance with one or more implementations of the present disclosure. The wireless transceiver 140 may be configured to operate in a first frequency band and a second frequency band that is different from the first frequency band. In some embodiments, the first frequency band may be used for a first wireless local area network (WLAN) and the second frequency band may be used for a second WLAN that is different from the first WLAN. The multiplexing element 104 may carry transmit and receive signals in both in the first WLAN and the second WLAN.

The first and second WLANs may be implemented using any of the 802.11 protocols or other suitable wireless standards or protocols. In these and other embodiments, the first and second frequency bands may be distinct radio frequency ranges that are defined for wireless communications. For example, the first and second frequency bands may be selected from among frequency bands that include 900 MHz, 2.4 GHz, 3.6 GHz, 5.0 GHz, 6 GHz, 60 GHz, or other frequency bands. Note that a frequency band may extend in a range of frequencies. For example, the 5.0 GHz band may include frequencies between 5.150 GHz and 5.85 GHz. The frequencies within a frequency band may be defined by governmental bodies and/or protocols and thus may be different in different regions. Each of the frequency bands may include multiple frequency channels. In these and other embodiments, frequency channels within a frequency band may include overlapping frequencies. However, the frequency bands discussed in this disclosure may not have overlapping frequencies.

As an example, the first WLAN may be configured to operate in the 5.0 GHz frequency band and the second WLAN may be configured to operate in the 6.0 GHz frequency band as defined in the 802.11 protocol. As another example, the first WLAN may be configured to operate in the 5.0 GHz frequency band and the second WLAN may be configured to operate in the 2.4 GHz frequency band as defined in the 802.11 protocol. The wireless transceiver 140 may be used for other frequency bands and protocols.

The wireless transceiver 140 may include a transmit/receive chain 142 that may be coupled between a conversion circuit 130 and an antenna element 102. The antenna element 102 may be configured to transmit and receive wireless signals transmitted over the first and second frequency bands.

During operation in the first frequency band and in the second frequency band, the wireless transceiver 140 may be configured to carry transmit signals from the conversion circuit 130 to the antenna element 102 over the transmit/receive chain 142 and to carry receive signals from the antenna element 102 to the conversion circuit 130 over the transmit/receive chain 142.

In some embodiments, the transmit/receive chain 142 may include an antenna node 103, a multiplexing element 104, a filter 106, a first amplifier circuit 110, a second amplifier circuit 112, and a switch unit 120 that may include a first switch element 122 and a second switch element 124.

The antenna node 103 of the wireless transceiver 140 may be coupled to an antenna element 102. The antenna node 103 may be an electrical node that is configured to pass electrical signals, such as transmit and receive signals between the wireless transceiver 140 and the antenna element 102.

The multiplexing element 104 may be coupled to the antenna node 103. The multiplexing element 104 may be configured to multiplex transmit signals in the first frequency band and transmit signals in the second frequency band onto a single signal path to the antenna element 102 through the antenna node 103. The multiplexing element 104 may be further configured to direct receive signals in the first frequency band and receive signals in the second frequency band received on the antenna node 103 into different signal paths. For example, the multiplexing element 104 may direct receive signals in the first frequency band to the filter 106 and direct receive signals in the second frequency band to the second amplifier circuit 112. In some embodiments, the multiplexing element 104 may include one or more filters to direct the receive signals. As an example, the multiplexing element 104 may include a diplexer circuit that includes filters configured for the first and second frequency bands.

The filter 106 may be configured to pass frequencies in the first frequency band and filter out frequencies in second frequency band. The filter 106 may be configured to pass a filtered receive signal in the first frequency band to the first amplifier circuit 110. The filter 106 may also be configured to filter transmit signals and pass the filtered transmit signals in the first frequency band to the multiplexing element 104.

The first amplifier circuit 110 may be configured to amplify receive signals in the first frequency band obtained from the filter 106. The first amplifier circuit 110 may provide the amplified receive signals to the second switch element 124. The first amplifier circuit 110 may be further configured to amplify transmit signals in the first frequency band obtained from the first switch element 122 and provide the amplified transmit signals to the filter 106. As an example, the first amplifier circuit 110 may include a power amplifier and a low-noise amplifier configured for the first frequency band. An example of the configuration of the first amplifier circuit 110 is provided with respect to FIG. 3.

The second amplifier circuit 112 may be configured to amplify receive signals in the second frequency band obtained from the multiplexing element 104. The second amplifier circuit 112 may be provided the amplified receive signals to the second switch element 124. The second amplifier circuit 112 may be further configured to amplify transmit signals in the second frequency band obtained from the first switch element 122 and provide the amplified transmit signals to the multiplexing element 104. As an example, the second amplifier circuit 112 may include a power amplifier and a low-noise amplifier configured for the second frequency band.

The switch unit 120 may be configured pass transmit to select between signal paths for the first frequency band and signal paths for the second frequency band within the transmit/receive chain 142 for transmit and receive signals. In these and other embodiments, the first switch element 122 may be configured to pass transmit signals and the second switch element 124 may be configured to pass receive signals.

For example, the first switch element 122 may be configured to selectively couple the conversion circuit 130 to the antenna element 102 by way of a first transmit signal path for the first frequency band that traverses the first amplifier circuit 110, the filter 106, and a first port of the multiplexing element 104 or by way of a second transmit signal path for the second frequency band that traverses the second amplifier circuit 112 and a second port of the multiplexing element 104.

The second switch element 124 may be configured to selectively couple the antenna element 102 to the conversion circuit 130 by way of a first receive signal path for the first frequency band that traverses the first amplifier circuit 110, the filter 106, and the first port of the multiplexing element 104 or by way of a second receive signal path for the second frequency band that traverses the second amplifier circuit 112 and the second port of the multiplexing element 104.

The conversion circuit 130 may be configured to convert the frequencies of signals between a baseband frequency and the first and second frequency bands. For example, with respect to transmit signals, the conversion circuit 130 may obtain a transmit signal at a baseband and upconvert the transmit signal to either one of the first and second frequency bands. The conversion circuit 130 may provide the transmit signal at the upconverted frequency to the switch unit 120. With respect to receive signals, the conversion circuit 130 may obtain the receive signal at either one of the first and second frequency bands from the switch unit 120 and may down-convert the receive signal to the baseband frequency.

The conversion circuit 130 may upconvert a transmit signal at a baseband frequency by mixing the transmit signal with a conversion signal. The conversion signal may be a frequency within the first frequency band or the second frequency band. When the conversion signal has a frequency within the first frequency band, the first switch element 122 may include select a transmit signal path through the transmit/receive chain 142 that corresponds with the first frequency band. When the up-conversion signal has a frequency within the second frequency band, the first switch element 122 may select a transmit signal path through the transmit/receive chain 142 that corresponds with the second frequency band.

The conversion circuit 130 may receive, from the second switch element 124, a receive signal at a frequency within the first frequency band or the second frequency band based on the configuration of the second switch element 124. For example, when the second switch element 124 selects a receive path through the transmit/receive chain 142 that corresponds with the first frequency band, the conversion circuit 130 may receive a receive signal within the first frequency band. When the second switch element 124 selects a receive path through the transmit/receive chain 142 that corresponds with the second frequency, the conversion circuit 130 may receive a receive signal within the second frequency band. Based on the frequency band of a receive band, the conversion circuit 130 may mix a conversion signal with the receive signal to obtain a receive signal in the baseband. In some embodiments, the conversion signal may be generated using phase-locked-loops or voltage-controlled oscillators, among other signal generators.

The wireless transceiver 140 as described includes amplification of transmit and receive signals in signal paths between the switch unit 120 and the multiplexing element 104. Amplification of the transmit and receive signal in unique signals between the switch unit 120 and the multiplexing element 104 may reduce a noise figure for receive signal in the wireless transceiver 140 and may reduce insertion loss for transmit signals in the wireless transceiver 140.

The selection of the frequency of the conversion signal and the selection of transmit and receive paths by the first switch element 122 and the second switch element 124 may be controlled by another processing circuit. Thus, the wireless transceiver 140 may operate in either one of the first and second frequency bands and may switch operation between the first and second frequency bands. For example, the wireless transceiver 140 may be configured to transmit signals in a first frequency band, switch the configuration of the wireless transceiver 140 and receive signals in the second frequency band and then transmit signal in the second frequency band. After receiving and transmitting in the second frequency band, the configuration of the wireless transceiver 140 may be switched to receive signals in the second frequency band. Any pattern of transmitting and receiving signals in the first and second frequency bands may be used by changing the configuration of the wireless transceiver 140 as described in this disclosure.

Modifications, additions, or omissions may be made to the environment 100 without departing from the scope of the present disclosure. For example, the environment 100 may include any number of other elements or may be implemented within other systems or contexts than those described. For example, the wireless transceiver 140 may be included within an access point (AP) of a WLAN. The AP may include a gateway, a repeater, a mesh node, and/or any other suitable device configured to host or control access to a WLAN. Alternately or additionally, the wireless transceiver 140 may be included in a device, such as a desktop computer, a laptop computer, a tablet computer, a mobile phone, a smartphone, a personal digital assistant (PDA), a smart device or appliance, an automobile or other type of personal vehicle, or any other suitable wireless station.

As another example, the first amplifier circuit 110 and the second amplifier circuit 112 are illustrated as separate. However, in some embodiments, the elements in the first amplifier circuit 110 and the second amplifier circuit 112, such as one or more amplifiers, may be shared between the first amplifier circuit 110 and the second amplifier circuit 112.

As another example, the wireless transceiver 140 may be configured for more than two frequency bands. For example, the wireless transceiver 140 may be configured for three, four, five, six, seven, or more frequency bands. In these and other embodiments, the wireless transceiver 140 may switch between the frequency bands as described above.

Figure 2:
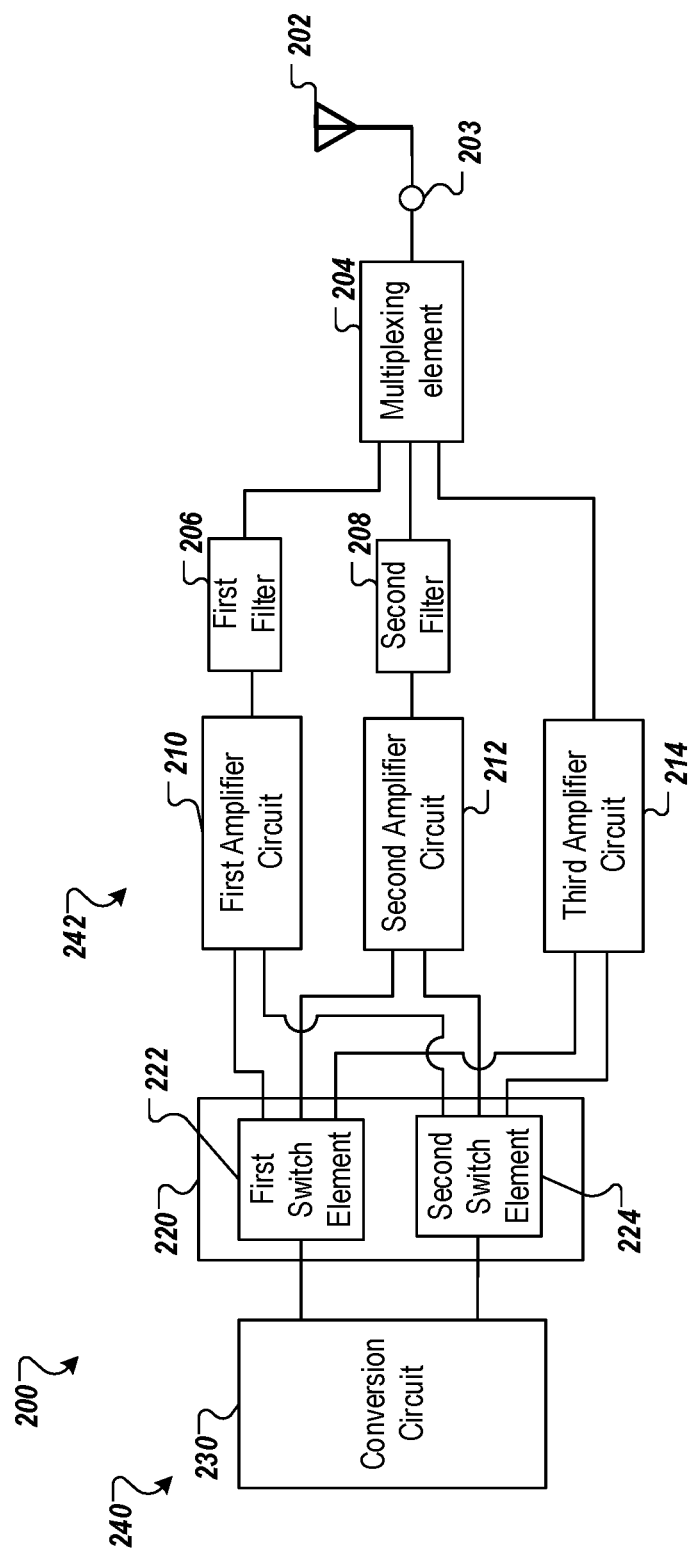
FIG. 2 illustrates another example environment that includes a wireless transceiver.

FIG. 2 illustrates an example environment 200 that includes another wireless transceiver 240 that may be configured to switch between three frequency bands, in accordance with one or more implementations of the present disclosure. The wireless transceiver 240 may include may be configured to operate in a first frequency band, a second frequency band, and a third frequency band that are each different and are each used for a different WLAN. For example, the first, second, and third frequency bands may be the 2.4 GHz band, the 5 GHz band, and the 6 GHz band, respectively.

The wireless transceiver 240 may include a transmit/receive chain 242 that may be coupled between a conversion circuit 230 and an antenna element 202. In some embodiments, the transmit/receive chain 242 may include an antenna node 203, a multiplexing element 204, a first filter 206, a second filter 208, a first amplifier circuit 210, a second amplifier circuit 212, a third amplifier circuit 214, and a switch unit 220 that may include a first switch element 222 and a second switch element 224. The wireless transceiver 240 may be configured similar to the wireless transceiver 140 of FIG. 1. Thus, with respect to FIG. 2, only the differences between the wireless transceivers 140 of FIG. 1 and the wireless transceiver 240 may be discussed.

The multiplexing element 204 may function similar to the multiplexing element 104 of FIG. 1 but may include a third port and a third filter that is configured for the third frequency band of the wireless transceiver 240. The first filter 206 and the second filter 208 may be similar to the filter 106 of FIG. 1, but the first filter 206 and the second filter 208 may be configured for the first and second frequency bands, respectively. The first amplifier circuit 210, the second amplifier circuit 212, and the third amplifier circuit 214 may operate similar to the first amplifier circuit 110 and the second amplifier circuit 112 of FIG. 1 but may be configured for the first, second, and third frequency bands, respectively.

The switch unit 220 may operate similar to the switch unit 120 of FIG. 1, expect the switch unit 220 may select between signal paths for the first, second, and third frequency bands. For example, the first switch element 222 may handle transmit signals and select between the first, second, and third frequency bands for each of the transmit signals. The second switch element 224 may handle receive signals and select between the first, second, and third frequency bands for each of the receive signals. The conversion circuit 230 may be similar to the conversion circuit 130 of FIG. 1 expect the conversion circuit 230 may apply conversion signals based on the first, second, and third frequency bands.

The wireless transceiver 240 may switch between any of the first, second, and third frequency bands for transmit or receive signals by selecting signal paths in the transmit/receive chain 242 that correspond to a selected frequency band in a manner similar to how the wireless transceivers 140 of FIG. 1 select between the first and second frequency bands.

Modifications, additions, or omissions may be made to the environment 200 without departing from the scope of the present disclosure. For example, the wireless transceiver 240 may be configured for more or less than three frequency bands.

Figure 3:
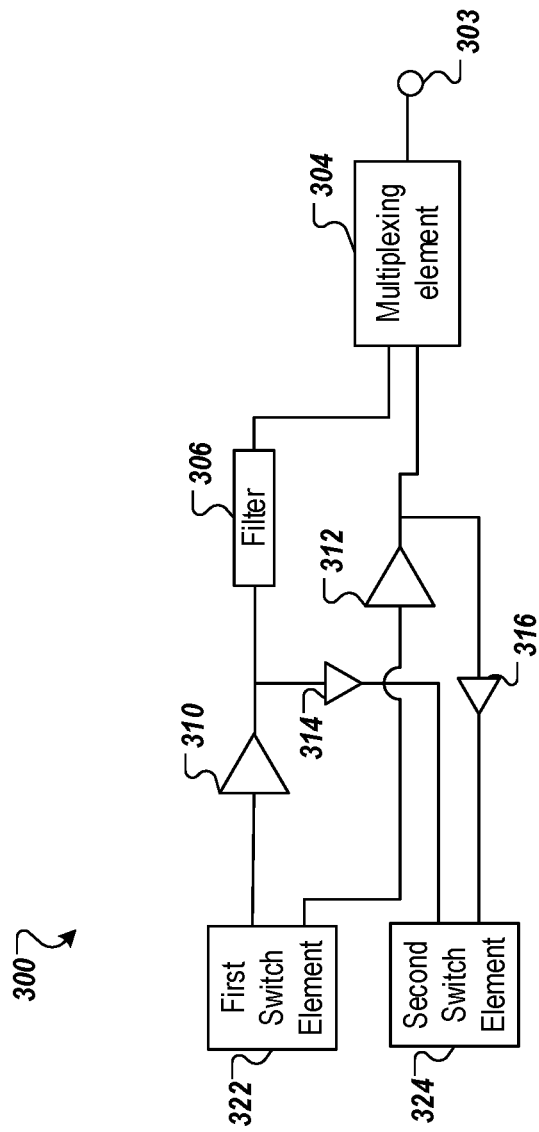
FIG. 3 illustrates an example transmit/receive chain.

FIG. 3 illustrates an example transmit/receive chain 300, in accordance with one or more implementations of the present disclosure. The transmit/receive chain 300 may be configured to handle transmit and receive signals in first and second frequency bands. The transmit/receive chain 300 may include an antenna node 303, a multiplexing element 304, a filter 306, a first amplifier 310, a second amplifier 312, a third amplifier 314, a fourth amplifier 316, a first switch element 322, and a second switch element 324. The transmit/receive chain 300 may be configured similar to the transmit/receive chain 142 of FIG. 1. Thus, with respect to FIG. 3, only the differences between the transmit/receive chain 142 of FIG. 1 and the transmit/receive chain 300 may be discussed.

The first amplifier 310 may be configured for transmit signals in the first frequency band. The second amplifier 312 may be configured for transmit signals in the second frequency band. The first amplifier 310 and the second amplifier 312 may be configured as power amplifiers that are configured to boost the power of the transmit signals provided to the antenna node 303 for transmission by an antenna. In some embodiments, the first amplifier 310 and the second amplifier 312 may include adjustable gains that may be configured by a control circuit, such as a processor circuit that control switching of the first switch element 322 and the second switch element 324.

The third amplifier 314 may be configured for receive signals in the first frequency band. The fourth amplifier 316 may be configured for receive signals in the second frequency band. The third amplifier 314 and the fourth amplifier 316 may be configured as low-noise amplifiers that are configured to boast the power of receive signals obtained from the antenna node 303. In some embodiments, the third amplifier 314 and the fourth amplifier 316 may include adjustable gains that may be configured by the control circuit.

Modifications, additions, or omissions may be made to the transmit/receive chain 300 without departing from the scope of the present disclosure. For example, the first amplifier 310 and the second amplifier 312 may be a single amplifier. In these and other embodiments, the outputs of the first switch element 322 may both feed the single amplifier and the outputs of the single amplifier may be provided to the filter 306 and the multiplexing element 304.

As another example, the third amplifier 314 and the fourth amplifier 316 may be a single amplifier. In these and other embodiments, the outputs of the filter 306 and the multiplexing element 304 may both feed the single amplifier and the outputs of the single amplifier may be provided to the inputs to the second switch element 324.

Figure 4:
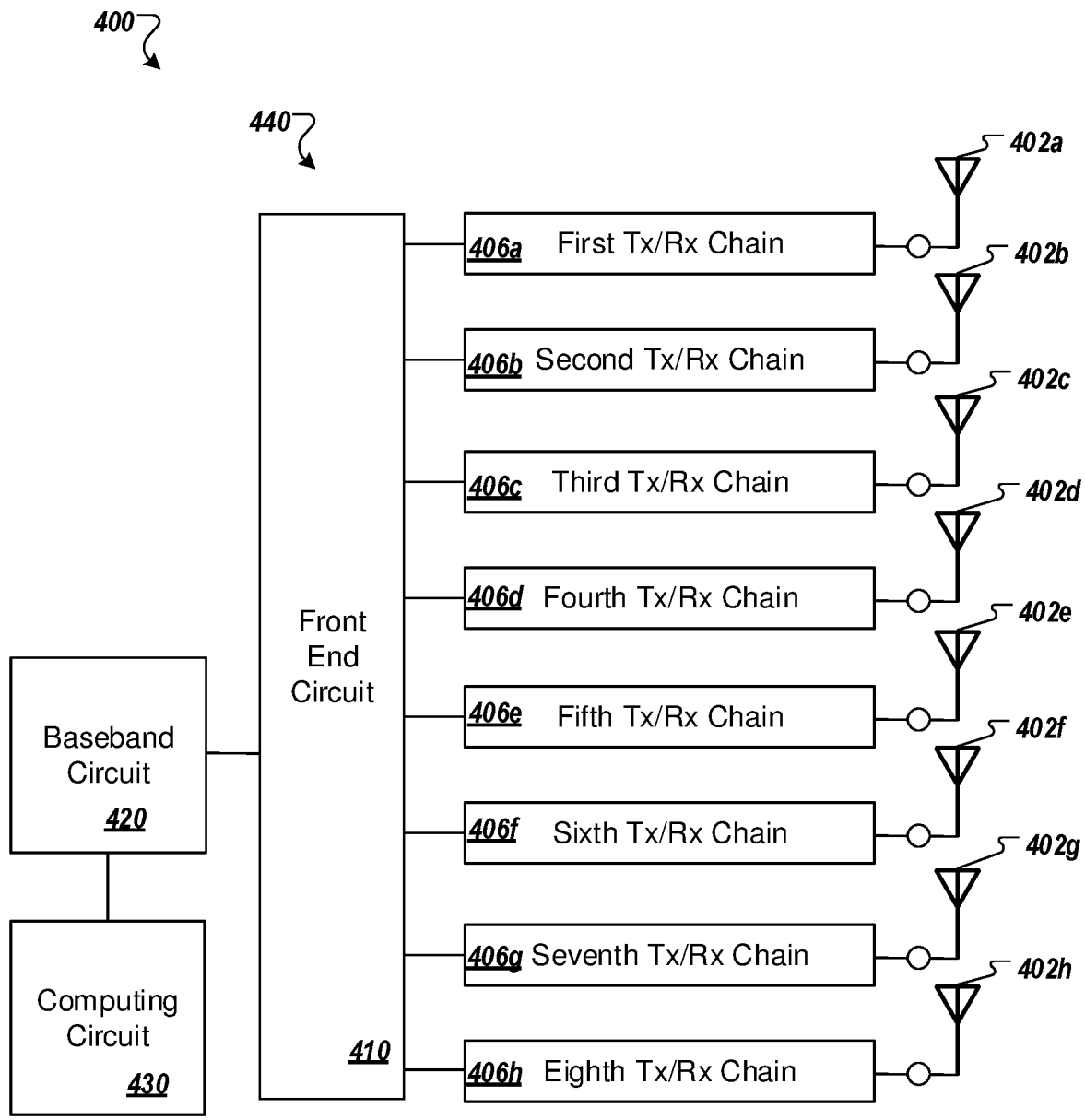
FIG. 4 illustrates another example environment that includes a wireless transceiver.

FIG. 4 illustrates another example environment 400 that includes a wireless transceiver 440, in accordance with one or more implementations of the present disclosure. The wireless transceiver 440 may include first, second, third, fourth, fifth, sixth, seventh, and eighth transmit/receive chains 406a-406h, referred to collectively as the transmit/receive chains 406, a front-end circuit 410, and a baseband circuit 420. The environment may additionally include a computing circuit 430 and a first, second, third, fourth, fifth, sixth, seventh, and eighth antenna elements 402a-402h, referred to collectively as the antenna elements 402. As illustrated, the each of the transmit/receive chains 406 may be coupled to one of the antenna elements 402. The computing circuit 430 may be coupled to the baseband circuit 420.

The wireless transceiver 440 may be configured to support any number of frequency bands. In these and other embodiments, the transmit/receive chains 406 may include signal paths for the supported frequency bands. The front-end circuit 410 may include a conversion circuit analogous to the conversion circuits 130 and 230 of FIGS. 1 and 2 configured for the supported frequency bands. The front-end circuit 410 may further include additional circuitry that may be configured to further condition transmit and receive signals for the supported frequency bands, such as filters, amplifiers, and other circuitry. Alternately or additionally, the front-end circuit 410 may include analog-to-digital converters and digital-to-analog converters configured to change transmit and receive signals between the analog and digital domains. For example, the front-end circuit 410 may receive digital signals from the baseband circuit 420 and provide analog signals to the transmit/receive chains 406 based on the digital signals. Alternately or additionally, the front-end circuit 410 may obtain analog signals from the transmit/receive chains 406 and provide digital signals to the baseband circuit 420 based on the analog signals.

The baseband circuit 420 may be configured to construct the transmit signals transmitted by the antenna elements 402. Construction of the transmit signals may include one or more processes such as framing of data, encoding the data in the frames, interleaving the frames for multiple-input multiple-output (MIMO) transmission using two or more of the antenna elements 402, transforming the data between a time and frequency domain, and/or applying weights to the transmit signals to create beamforming patterns by the antenna elements 402, among other processes. The baseband circuit 420 may also be configured to process receive signals obtain by the antenna elements 402. The receive signals may be processed by applying weights to the receive signals for beamforming patterns of the antenna elements 402, deinterleaving frames of the receive signals, deconstructing frames of the receive signals, decode the receive signals, and/or transforming the receive signals between the time and frequency domain, among other processes.

The computing circuit 430 may be configured to provide data to the baseband circuit 420 for transmission and process data received by the computing circuit 430. For example, the computing circuit 430 may include computer-readable instructions that when executed follow the protocols of the one or more WLAN in which the wireless transceiver 440 operates. An example of the computing circuit 430 may include the processing device 602, main memory 604, and data storage device 616 of FIG. 6.

In some embodiments, the wireless transceiver 440 may operate in any number of configurations based on the number of frequency bands supported by the wireless transceiver 440. For example, when the wireless transceiver 440 supports two frequency bands, the wireless transceiver 440 may be configured as two synchronous radios for different WLANs that may support any number of different MIMO configurations for the different WLANs. For example, the configurations may include 0x8, 1x7, 2x6, 3x5, and 4x4 type configurations among other permutations where the first number represents the number of transmit/receive chains 406 configured for a first frequency band and the second number represents the number of transmit/receive chains 406 configured for a second frequency band. As a result, the wireless transceiver 440 may function to transmit/receive in a first frequency band in a first WLAN and to transmit/receive in a second frequency band in a second WLAN in substantially overlapping time periods, such as simultaneously.

As another example, for three frequency bands, the configurations may include 0x0x8, 0x2x6, 0x4x4, 1x3x4, 2x2x4, 4x2x2, 6x2x0, 8x0x0, among the other permutations possible where the first number represents the number of transmit/receive chains 406 configured for a first frequency band, the second number represents the number of transmit/receive chains 406 configured for a second frequency band, and the third number represents the number of transmit/receive chains 406 for a third frequency band. As a result, the wireless transceiver 440 may function to transmit/receive in first, second, and third frequency bands in first, second, and third WLANs in substantially overlapping time periods, such as simultaneously.

In some embodiments, the computing circuit 430 may be configured to select and direct the change of the configuration of the wireless transceiver 440. Thus, the configuration of the wireless transceiver 440 may not be a static configuration that is merely maintained after manufacture. Rather, the configuration of the wireless transceiver 440 may change at random or set intervals based on an analysis of the performance of the wireless transceiver 440 or other devices in the WLANs in which the wireless transceiver 440 is participating or hosting. To change the configuration, switching elements within the transmit/receive chains 406 and conversion signals applied by the front-end circuit 410 may be changed among other changes to the wireless transceiver 440.

Modifications, additions, or omissions may be made to the environment 400 without departing from the scope of the present disclosure. For example, the wireless transceiver 440 may include more or less than eight transmit/receive chains 406, such as a 4, 6, 10, 12, 16, 32, or 64 transmit/receive chains, among other number of transmit/receive chains.

Figure 5:
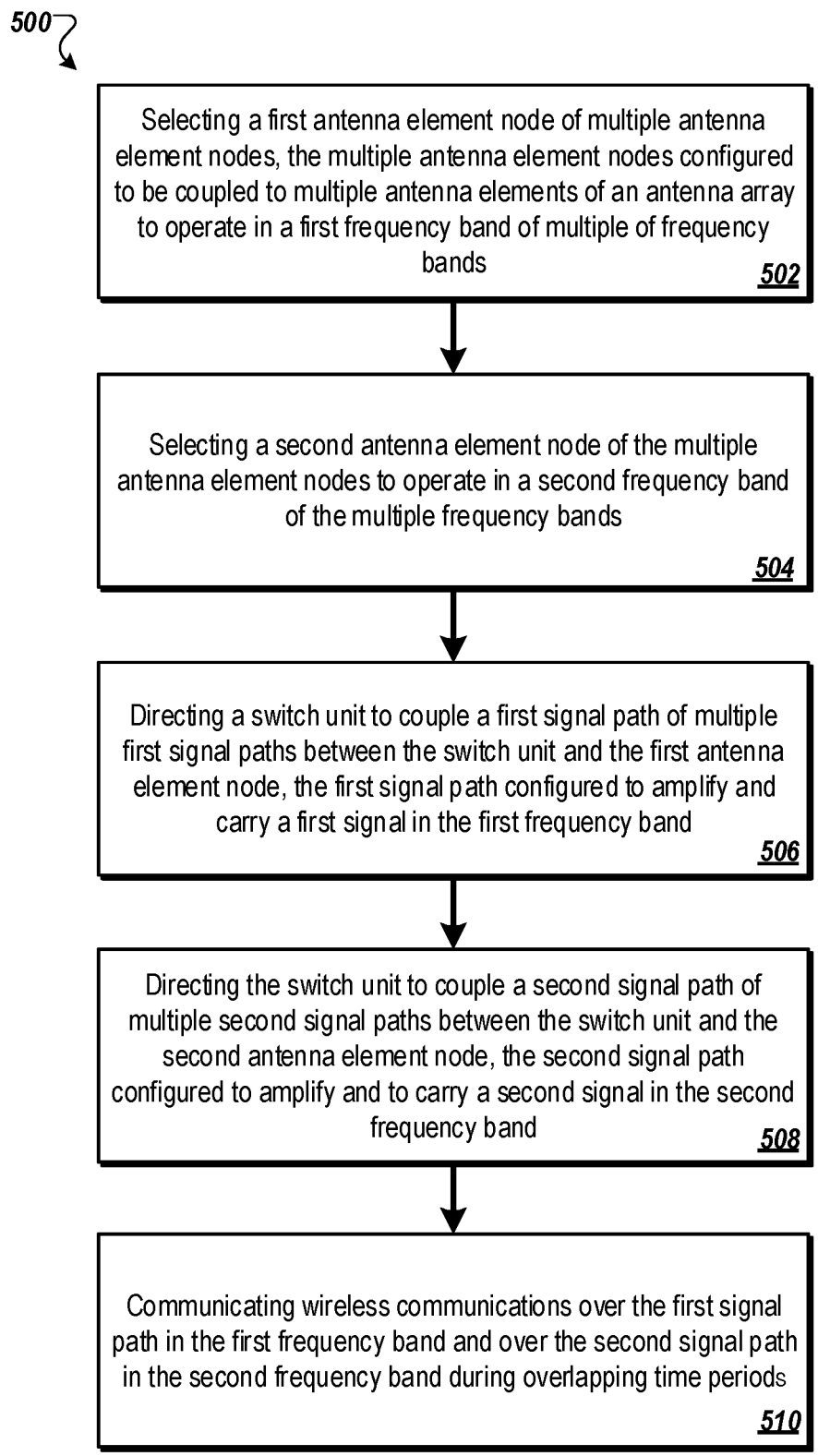
FIG. 5 illustrates a flowchart of an example method of wireless data transmission.

FIG. 5 illustrates a flowchart of an example method 500 of wireless data transmission, in accordance with one or more implementations of the present disclosure. The method 500 may be implemented, in whole or in part, by one or more of the wireless transceivers 140, 240, or 440 of FIGS. 1, 2, and 4.

At block 502, a first antenna element node of multiple antenna element nodes may be selected. In some embodiments, the multiple antenna element nodes may be configured to be coupled to multiple antenna elements of an antenna array to operate in a first frequency band of multiple frequency bands.

At block 504, a second antenna element node of the multiple antenna element nodes may be selected to operate in a second frequency band of the multiple frequency bands. In some embodiments, the first frequency band and the second frequency band may be distinct frequency bands defined under the 802.11 protocol. Selection of the first and second antenna element nodes may be analogous to selection of antenna elements coupled to the first and second antenna element nodes.

At block 506, a switch unit may be directed to couple a first signal path of multiple first signal paths between the switch unit and the first antenna element node. In some embodiments, the first signal path may be configured to amplify and carry a first signal in the first frequency band.

At block 508, the switch unit may be directed to couple a second signal path of multiple second signal paths between the switch unit and the second antenna element node. In some embodiments, the second signal path may be configured to amplify and to carry a second signal in the second frequency band.

At block 510, wireless communications may be communicated over the first signal path in the first frequency band and over the second signal path in the second frequency band during overlapping time periods.

One skilled in the art will appreciate that, for this and other processes and methods disclosed herein, the functions performed in the processes and methods may be implemented in differing order, simultaneously, etc. Furthermore, the outlined steps and operations are only provided as examples, and some of the steps and operations may be optional, combined into fewer steps and operations, or expanded into additional steps and operations without detracting from the essence of the disclosed implementations.

For example, the method 500 may further include directing the switch unit to couple a third signal path of multiple third signal paths between the switch unit and the first antenna element node. In these and other embodiments, the third signal path configured to amplify and carry a third signal in the first frequency band. The method 500 may further include communicating wireless communications over the third signal path in the first frequency band and over the second signal path in the second frequency band during overlapping time periods. In these and other embodiments, the first signal path may be configured to transmit the first signal and the third signal path may be configured to receive the third signal.

In some embodiments, the method 500 may further include after communicating wireless communications over the first signal path in the first frequency band and over the second signal path in the second frequency band during overlapping time periods, directing the switch unit to couple a third signal path of the multiple first signal paths between the switch unit and the first antenna element node. In some embodiments, the third signal path may be configured to amplify and carry a third signal in the second frequency band. The method 500 may further include communicating wireless communications over the third signal path in the second frequency band and over the second signal path in the second frequency band during overlapping time periods.

In some embodiments, the method 500 may further include selecting a third antenna element node of the multiple antenna element nodes to operate in a third frequency band of the multiple frequency bands and directing the switch unit to couple a third signal path of multiple third signal paths between the switch unit and the third antenna element node. In these and other embodiments, the third signal path may be configured to amplify and carry a third signal in the first frequency band. In these and other embodiments, the method 500 may further include communicating wireless communications over the first signal path in the first frequency band, over the second signal path in the second frequency band, and over the third signal path in the third frequency band during overlapping time periods.

Figure 6:
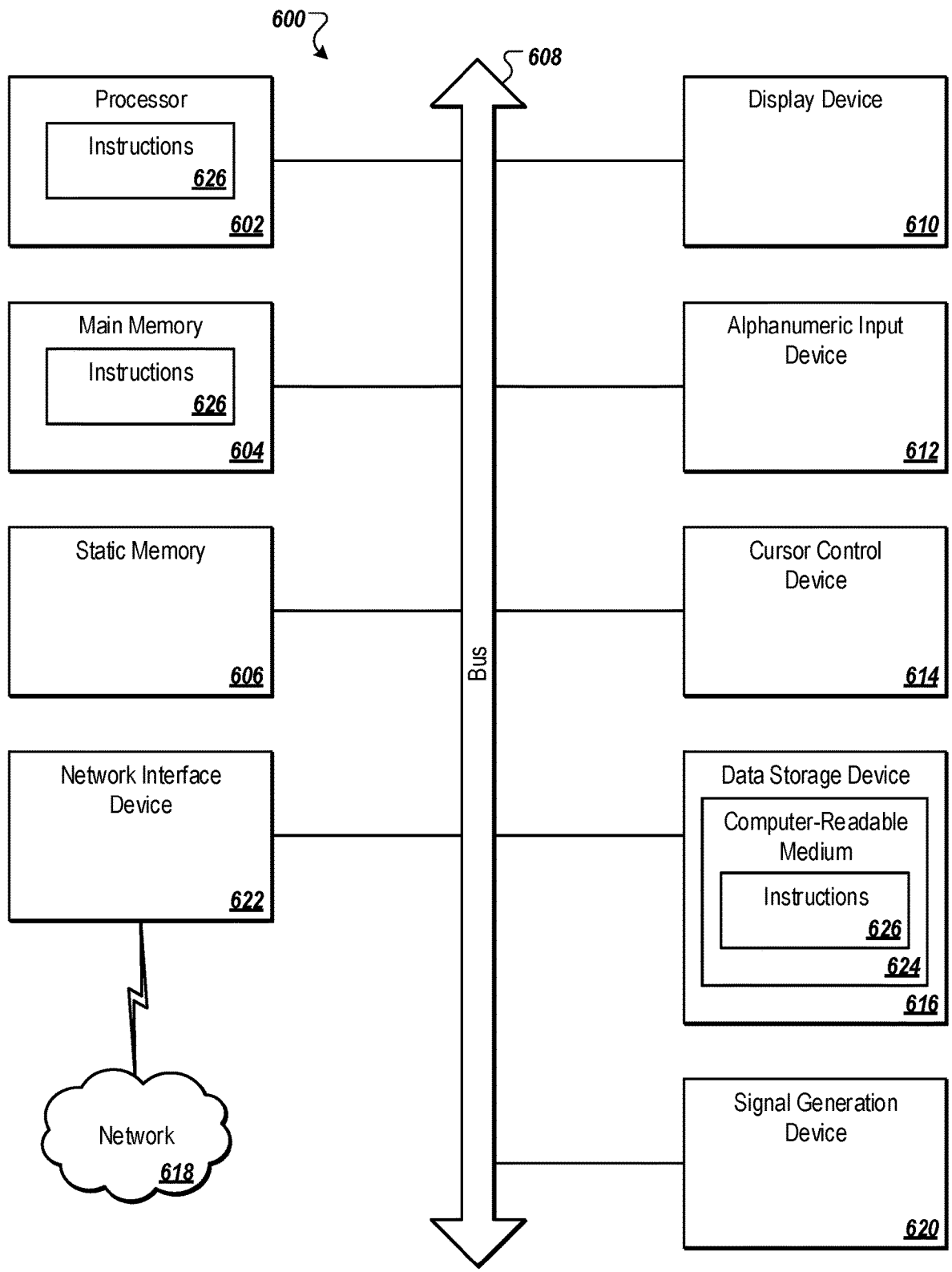
FIG. 6 illustrates a diagrammatic representation of a machine in the example form of a computing device that may include a wireless transceiver.

FIG. 6 illustrates a diagrammatic representation of a machine in the example form of a computing device 600 within which a set of instructions, for causing the machine to perform any one or more of the methods discussed herein, may be executed. The computing device 600 may include a mobile phone, a smart phone, a netbook computer, a rack-mount server, a router computer, a server computer, a personal computer, a mainframe computer, a laptop computer, a tablet computer, a desktop computer, or any computing device with at least one processor, etc., within which a set of instructions, for causing the machine to perform any one or more of the methods discussed herein, may be executed. In alternative implementations, the machine may be connected (e.g., networked) to other machines in a LAN, an intranet, an extranet, or the Internet. The machine may operate in the capacity of a server machine in client-server network environment. The machine may include a personal computer (PC), a set-top box (STB), a server, a network router, switch or bridge, or any machine capable of executing a set of instructions (sequential or otherwise) that specify actions to be taken by that machine. Further, while only a single machine is illustrated, the term "machine" may also include any collection of machines that individually or jointly execute a set (or multiple sets) of instructions to perform any one or more of the methods discussed herein.

The example computing device 600 includes a processing device (e.g., a processor) 602, a main memory 604 (e.g., read-only memory (ROM), flash memory, dynamic random access memory (DRAM) such as synchronous DRAM (SDRAM)), a static memory 606 (e.g., flash memory, static random access memory (SRAM)) and a data storage device 616, which communicate with each other via a bus 608.

Processing device 602 represents one or more general-purpose processing devices such as a microprocessor, central processing unit, or the like. More particularly, the processing device 602 may include a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 602 may also include one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein.

The computing device 600 may further include one or more network interface devices 622 which may communicate with one or more networks 618. The computing device 600 also may include a display device 610, an alphanumeric input device 612 (e.g., a keyboard), a cursor control device 614 (e.g., a mouse) and a signal generation device 620 (e.g., a speaker). In at least one implementation, the display device 610, the alphanumeric input device 612, and/or the cursor control device 614 may be combined into a single component or device.

The data storage device 616 may include a computer-readable storage medium 624 on which is stored one or more sets of instructions 626 embodying any one or more of the methods or functions described herein. The instructions 626 may also reside, completely or at least partially, within the main memory 604 and/or within the processing device 602 during execution thereof by the computing device 600, the main memory 604 and the processing device 602 also constituting computer-readable media. The instructions may further be transmitted or received over a network 618 via the network interface device 622.

While the computer-readable storage medium 624 is shown in an example implementation to be a single medium, the term "computer-readable storage medium" may include a single medium or multiple media (e.g., a centralized or distributed database and/or associated caches and servers) that store the one or more sets of instructions. The term "computer-readable storage medium" may also include any medium that is capable of storing, encoding, or carrying a set of instructions for execution by the machine and that cause the machine to perform any one or more of the methods of the present disclosure. The term "computer-readable storage medium" may accordingly be taken to include, but not be limited to, solid-state memories, optical media, and magnetic media.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of configured operations leading to a desired end state or result. In example implementations, the operations carried out require physical manipulations of tangible quantities for achieving a tangible result.

Unless specifically stated otherwise, as apparent from the discussion, it is appreciated that throughout the description, discussions utilizing terms such as detecting, determining, analyzing, identifying, scanning or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. Computer-executable instructions may include, for example, instructions and data which cause a general-purpose computer, special-purpose computer, or special-purpose processing device (e.g., one or more processors) to perform or control performance of a certain function or group of functions.

Although the subject matter has been described in language specific to structural features and/or methodological acts, it is to be understood that the subject matter configured in the appended claims is not necessarily limited to the specific features or acts described above. Rather, the specific features and acts described above are disclosed as example forms of implementing the claims.

An example apparatus can include a Wireless Access Point (WAP) or a station and incorporating a VLSI processor and program code to support. An example transceiver couples via an integral modem to one of a cable, fiber, or digital subscriber backbone connection to the Internet to support wireless communications, e.g. IEEE 802.11 compliant communications, on a Wireless Local Area Network (WLAN). The WIFI stage includes a baseband stage, and the analog front end (AFE) and Radio Frequency (RF) stages. In the baseband portion wireless communications transmitted to or received from each user/client/station are processed. The AFE and RF portion handles the up conversion on each of transmit paths of wireless transmissions initiated in the baseband. The RF portion also handles the down conversion of the signals received on the receive paths and passes them for further processing to the baseband.

An example apparatus can be a multiple-input multiple-output (MIMO) apparatus supporting as many as N×N discrete communication streams over N antennas. In an example the MIMO apparatus signal processing units can be implemented as N×N. In various implementations, the value of N can be 4, 6, 8, 12, 16, etc. Extended MIMO operation enables the use of up to 2N antennae in communication with another similarly equipped wireless system. It should be noted that extended MIMO systems can communicate with other wireless systems even if the systems do not have the same number of antennae, but some of the antennae of one of the stations might not be utilized, reducing optimal performance.

Channel State Information (CSI) from any of the devices described herein can be extracted independent of changes related to channel state parameters and used for spatial diagnosis services of the network such as motion detection, proximity detection, and localization which can be utilized in, for example, WLAN diagnosis, home security, health care monitoring, smart home utility control, elder care, automotive tracking and monitoring, home or mobile entertainment, automotive infotainment, and the like.

Unless specific arrangements described herein are mutually exclusive with one another, the various implementations described herein can be combined in whole or in part to enhance system functionality and/or to produce complementary functions. Likewise, aspects of the implementations may be implemented in standalone arrangements. Thus, the above description has been given by way of example only and modification in detail may be made within the scope of the present invention.

The subject technology of the present invention is illustrated, for example, according to various aspects described below. Various examples of aspects of the subject technology are described as numbered examples (1, 2, 3, etc.) for convenience. These are provided as examples and do not limit the subject technology. The aspects of the various implementations described herein may be omitted, substituted for aspects of other implementations, or combined with aspects of other implementations unless context dictates otherwise. For example, one or more aspects of example 1 below may be omitted, substituted for one or more aspects of another example (e.g., example 2) or examples, or combined with aspects of another example. The following is a non-limiting summary of some example implementations presented herein.

Example 1 may include a device that includes an antenna node configured to be coupled to an antenna element. The antenna node may be configured to pass wireless communications over multiple frequency bands. The device may also include multiple signal paths coupled to the antenna node. Each of the multiple signal paths may be configured to carry a signal from a different one of the multiple frequency bands. The device may further include a switch element coupled to the antenna node by the multiple signal paths and an amplifier circuit within the multiple signal paths between the switch element and the antenna node. The amplifier circuit may be configured to amplify the signals carried by the multiple signal paths.

Example 2 may include a device that includes multiple antenna nodes each configured to be coupled to different one of multiple antenna elements. The multiple antenna nodes may be configured to pass wireless communications over multiple frequency bands. The device may also include multiple signal paths coupled to the plurality of antenna nodes and a switch unit coupled to the multiple antenna nodes by the multiple signal paths such that each of the multiple antenna nodes is coupled to the switch unit by a subset of the multiple signals paths and the subset includes four or more signal paths. The device may also include multiple amplifier circuits within the multiple signal paths between the switch units and the multiple antenna nodes. The multiple amplifier circuits may be configured to amplify the signals carried by the multiple signal paths. The device may further include a conversion circuit coupled to the switch unit. The conversion circuit may be configured to adjust a frequency of a first signal, carried by a first signal path of the plurality of signal paths, based on a first frequency band of the multiple frequency bands and to adjust a frequency of a second signal, carried by a second signal path of the multiple signal paths, based on a second frequency band of the plurality of frequency bands, wherein a first antenna node of the multiple antenna nodes is configured to pass the first signal and a second antenna node of the multiple antenna nodes is configured to pass the second signal during overlapping time periods.

Example 3 may include the method described with respect to FIG. 5. For example the method may include selecting a first antenna element node of multiple antenna element nodes, the multiple antenna element nodes configured to be coupled to multiple antenna elements of an antenna array to operate in a first frequency band of multiple frequency bands. The method may also include selecting a second antenna element node of the multiple antenna element nodes to operate in a second frequency band of the multiple frequency bands and directing a switch unit to couple a first signal path of multiple first signal paths between the switch unit and the first antenna element node, the first signal path configured to amplify and carry a first signal in the first frequency band. The method may also include directing the switch unit to couple a second signal path of multiple second signal paths between the switch unit and the second antenna element node, the second signal path configured to amplify and to carry a second signal in the second frequency band and communicating wireless communications over the first signal path in the first frequency band and over the second signal path in the second frequency band during overlapping time periods.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

The present disclosure may be embodied in other specific forms without departing from its spirit or essential characteristics. The described implementations are to be considered in all respects only as illustrative and not restrictive. The scope of the present disclosure is, therefore, indicated by the appended claims rather than by the foregoing description. All changes which come within the meaning and range of equivalency of the claims are to be embraced within their scope.

What is claimed is:

1. A device comprising:
   an antenna node configured to be coupled to an antenna element, the antenna node configured to pass wireless communications over a plurality of frequency bands;
   a plurality of antenna nodes that include the antenna node, each of the plurality of antenna nodes configured to be coupled to different one of a plurality of antenna elements that include the antenna element;
   a plurality of signal paths coupled to the antenna node, each of the plurality of signal paths configured to carry a signal from a different one of the plurality of frequency bands;
   a second plurality of signal paths that include the plurality of signal paths;
   a switch element coupled to the antenna node by the plurality of signal paths;
   a plurality of switch elements that include the switch element, the plurality of switch elements each coupled to a different one of the plurality of antenna node by a different subset of the second plurality of signal paths, the plurality of signal paths being one subset of the second plurality of signal paths;
   an amplifier circuit within the plurality of signal paths between the switch element and the antenna node, the amplifier circuit configured to amplify the signals carried by the plurality of signal paths; and
   a plurality of amplifier circuits that include the amplifier circuit within the plurality of signal paths between the plurality of switch elements and the plurality of antenna nodes, the plurality of amplifier circuits configured to amplify the signals carried by the plurality of signal paths.

2. The device of claim 1, further comprising a second switch element coupled to the antenna node by a plurality of second signal paths, each of the plurality of second signal paths configured to carry a second signal from a different one of the plurality of frequency bands.

3. The device of claim 2, further comprising a filter element between the antenna node and the switch element and between the antenna node and the second switch element, wherein one of the plurality of signal paths and one of the plurality of second signal paths both include the filter element.

4. The device of claim 2, further comprising a conversion circuit coupled to the switch element, the conversion circuit configured to adjust a frequency of the signal based on a frequency band of the plurality of frequency bands selected for the signal, wherein the switch element is configured to selectively couple any one of the plurality of signal paths to the conversion circuit.

5. The device of claim 4, wherein the conversion circuit is coupled to the second switching element and the second switch element is configured to selectively couple any one of the plurality of second signal paths to the conversion circuit.

6. The device of claim 4, wherein the plurality of signal paths are transmit signal paths and the plurality of second signal paths are receive signal paths.

7. The device of claim 1, wherein the plurality of signal paths are configured to carry a transmission signal, or the plurality of signal paths are configured to carry a receive signal.

8. The device of claim 1, further comprising a multiplexing element coupled between the plurality of signal paths and the antenna node.

9. A device comprising:
   a plurality of antenna nodes each configured to be coupled to different one of a plurality of antenna elements, the plurality of antenna nodes configured to pass wireless communications over a plurality of frequency bands;
   a plurality of signal paths coupled to the plurality of antenna nodes;
   a switch unit coupled to the plurality of antenna nodes by the plurality of signal paths such that each of the plurality of antenna nodes is coupled to the switch unit by a subset of the plurality of signals paths and the subset includes four or more signal paths;
   a plurality of amplifier circuits within the plurality of signal paths between the switch units and the plurality of antenna nodes, the plurality of amplifier circuits configured to amplify the signals carried by the plurality of signal paths; and
   a conversion circuit coupled to the switch unit, the conversion circuit configured to adjust a frequency of a first signal, carried by a first signal path of the plurality of signal paths, based on a first frequency band of the plurality of frequency bands and to adjust a frequency of a second signal, carried by a second signal path of the plurality of signal paths, based on a second frequency band of the plurality of frequency bands, wherein a first antenna node of the plurality of antenna nodes is configured to pass the first signal and a second antenna node of the plurality of antenna nodes is configured to pass the second signal during overlapping time periods.

10. The device of claim 9, wherein the first signal path and the second signal path are both receive signal paths, are both transmit signal paths, or one of the first and second signal paths is a receive signal path and another of the first and second signal paths is a transmit signal path.

11. The device of claim 9, wherein the conversion circuit is further configured to adjust a frequency of a third signal, carried by a third signal path of the plurality of signal paths, based on a third frequency band of the plurality of frequency bands, wherein the first antenna node is configured to pass the first signal and the second antenna node is configured to pass the second signal, and a third antenna node of the plurality of antenna nodes is configured to pass the third signal during overlapping time periods.

12. The device of claim 9, wherein the switch unit is configured to selectively couple any one of the plurality of signal paths to the conversion circuit.

13. The device of claim 9, further comprising a plurality of multiplexing elements coupled between the plurality of signal paths and the plurality of antenna nodes.

14. A method of wireless data transmission, the method comprising:
- selecting a first antenna element node of a plurality of antenna element nodes, the plurality of antenna element nodes configured to be coupled to plurality of antenna elements of an antenna array to operate in a first frequency band of a plurality of frequency bands;
- selecting a second antenna element node of the plurality of antenna element nodes to operate in a second frequency band of the plurality of frequency bands;
- directing a switch unit to couple a first signal path of a plurality of first signal paths between the switch unit and the first antenna element node, the first signal path configured to amplify and carry a first signal in the first frequency band;
- directing the switch unit to couple a second signal path of a plurality of second signal paths between the switch unit and the second antenna element node, the second signal path configured to amplify and to carry a second signal in the second frequency band; and
- communicating wireless communications over the first signal path in the first frequency band and over the second signal path in the second frequency band during overlapping time periods.

15. The method of claim 14, wherein the first frequency band and the second frequency band are distinct frequency bands defined under the 802.11 protocol.

16. The method of claim 14, further comprising:
- directing the switch unit to couple a third signal path of a plurality of third signal paths between the switch unit and the first antenna element node, the third signal path configured to amplify and carry a third signal in the first frequency band; and
- communicating wireless communications over the third signal path in the first frequency band and over the second signal path in the second frequency band during overlapping time periods.

17. The method of claim 16, wherein the first signal path is configured to transmit the first signal and the third signal path is configured to receive the third signal.

18. The method of claim 14, further comprising:
- after communicating wireless communications over the first signal path in the first frequency band and over the second signal path in the second frequency band during overlapping time periods, directing the switch unit to couple a third signal path of the plurality of first signal paths between the switch unit and the first antenna element node, the third signal path configured to amplify and carry a third signal in the second frequency band; and
- communicating wireless communications over the third signal path in the second frequency band and over the second signal path in the second frequency band during overlapping time periods.

19. The method of claim 14, further comprising:
- selecting a third antenna element node of the plurality of antenna element nodes to operate in a third frequency band of the plurality of frequency bands;
- directing the switch unit to couple a third signal path of a plurality of third signal paths between the switch unit and the third antenna element node, the third signal path configured to amplify and carry a third signal in the first frequency band; and
- communicating wireless communications over the first signal path in the first frequency band, over the second signal path in the second frequency band, and over the third signal path in the third frequency band during overlapping time periods.

* * * * *